United States Patent [19]

Muller et al.

[11] Patent Number: 4,740,410
[45] Date of Patent: Apr. 26, 1988

[54] MICROMECHANICAL ELEMENTS AND METHODS FOR THEIR FABRICATION

[75] Inventors: Richard S. Muller, Kensington; Longsheng Fan, Berkeley; Yu C. Tai, Albany, all of Calif.

[73] Assignee: The Regents of the University of California, Berkeley, Calif.

[21] Appl. No.: 55,027

[22] Filed: May 28, 1987

[51] Int. Cl.$^4$ .................. H01L 21/306; B44C 1/22; C03C 15/00; C23F 1/02
[52] U.S. Cl. .................. 428/133; 156/643; 156/644; 156/651; 156/653; 156/656; 156/657; 156/662; 428/138; 428/174; 428/597; 428/603
[58] Field of Search .............. 156/626, 643, 644, 646, 156/645, 651, 652, 653, 656, 657, 659.1, 661.1, 662, 667; 357/26, 65, 69, 71, 76; 174/68.5; 361/400, 404; 29/610 SG; 338/2-6; 428/131, 133, 134, 137, 138, 139, 174, 596, 597, 601, 603; 346/75, 140 R

[56] References Cited

U.S. PATENT DOCUMENTS

| | | | |
|---|---|---|---|
| 3,407,476 | 10/1968 | Hamren | 156/655 X |
| 3,846,166 | 11/1974 | Saiki et al. | 156/656 X |
| 4,021,766 | 5/1977 | Aine | 29/610 SG |
| 4,070,752 | 1/1978 | Robinson | 156/659.1 X |
| 4,262,399 | 4/1981 | Cady | 156/656 X |
| 4,566,935 | 1/1986 | Hornbeck | 156/656 X |
| 4,654,676 | 3/1987 | Itano et al. | 156/661.1 X |

*Primary Examiner*—William A. Powell
*Attorney, Agent, or Firm*—Owen, Wickersham & Erickson

[57] ABSTRACT

A method and the product resulting from the method, for making a microminiature structure with two or more members measuring less than 1000 micrometers in any linear dimension and relatively movable to each other, comprising the steps of (a) providing a first sacrificial coating over a substrate having openings therethrough to expose a portion of the substrate, (b) depositing a first structural layer over the first sacrificial coating and the exposed portion of the substrate, with openings therethrough to expose a second portion of the substrate, (c) providing a second sacrificial coating over the second exposed portion of the substrate and said first structural layer, with openings through both the first and second sacrificial layers to expose a third portion of the substrate, (d) adding a second structural layer thereover and defining it, (e) possibly adding alternately other sacrificial coatings and other structural layers, and (f) etching the first and second and other sacrificial layers to remove them completely so that the two or more structural layers become movable relative to each other.

40 Claims, 7 Drawing Sheets

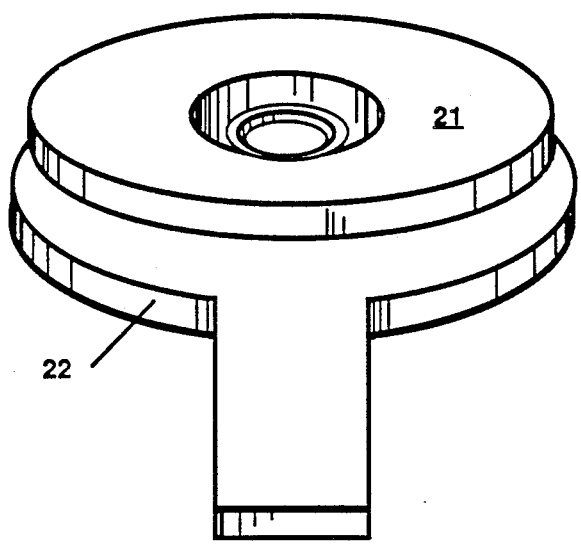
FIG. 1
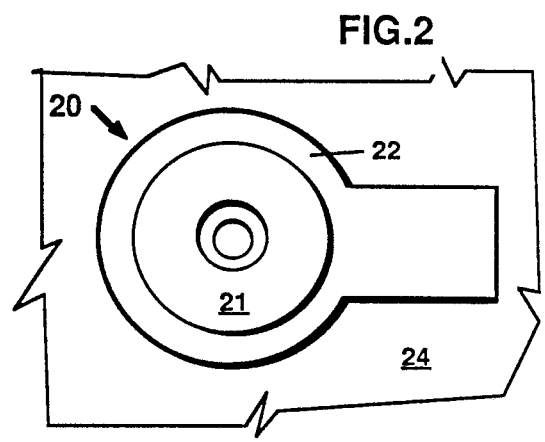
FIG. 2
FIG. 3
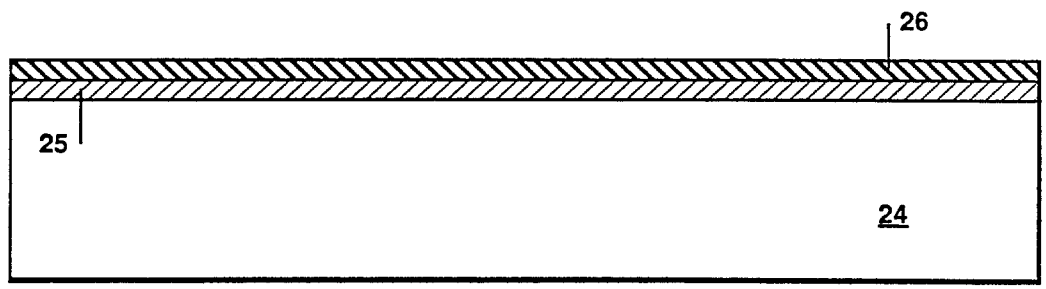
FIG. 4
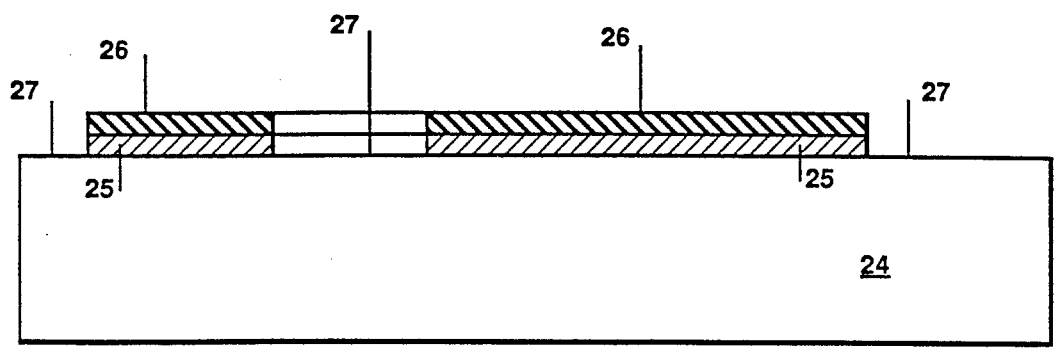

FIG. 9
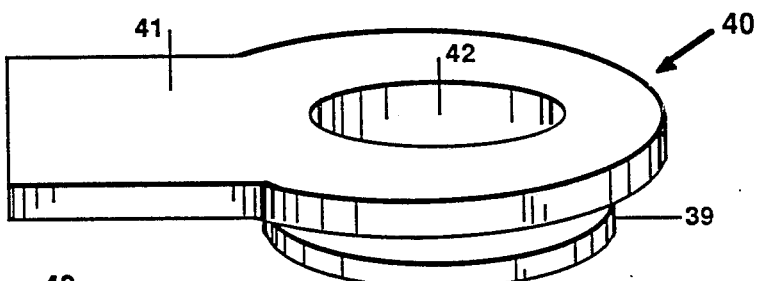
FIG. 10
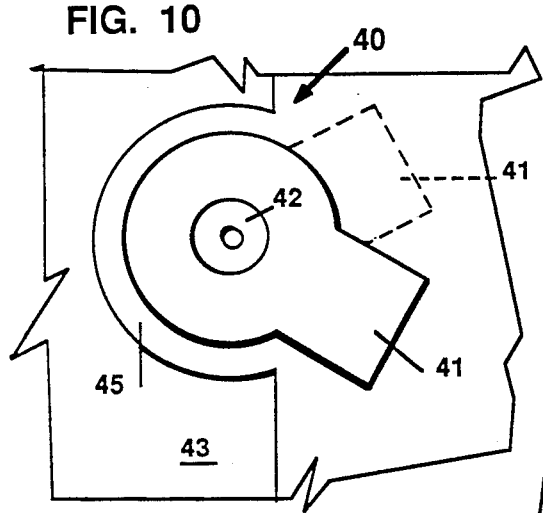
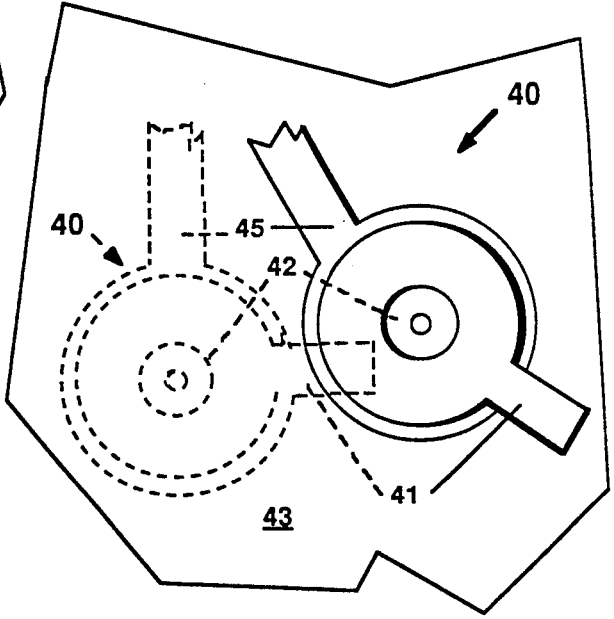
FIG. 11
FIG. 12
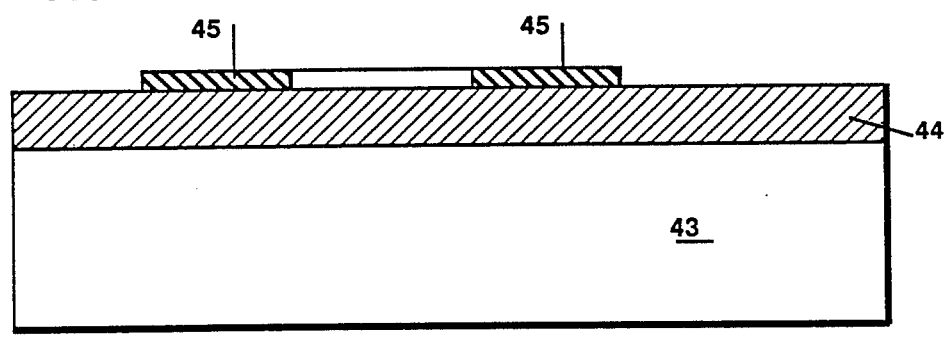

MICROMECHANICAL ELEMENTS AND METHODS FOR THEIR FABRICATION

This invention relates to novel mechanical elements such as movable joints, levers, gears, sliders, and springs, having dimensions in the order of one-tenth to one-thousand micrometers (one millionth of a meter), and to methods for making such elements with high precision.

BACKGROUND OF THE INVENTION

Micromechanical structures, such as cantilever bridges, doubly supported bridges, and diaphragms have been made and used for sensor applications. However, until now no micromechanical structures have been made with joints that are rotatable, sliding, translating or in combinations of these degrees of freedom. Also no mechanical energy-storage elements (such as springs) have been made in this dimensional range. Potential uses for such structures are many, and the present invention is directed to them. Uses include the production of miniature pin joints, gears, ratchets, cranks, slides, springs and other mechanisms which have almost numberless applications in macroscopic assemblies.

An object of this invention is to provide micromechanical joints with fixed and rotating members having or capable of having dimensions measured in the ranges afforded by present day microfabrication lithography, typically from tenths of micrometers to hundreds of micrometers.

Another object is to provide micromechanical elements and joints with relatively translatable parts, such as relatively sliding members.

Another object is to make such mechanical elements by using thin-film technology for the structural members and integrated-circuit microfabrication technologies for their overall production.

Manufacture of such joints opens important avenues for further development. The new structures of this invention can be batch-fabricated into multi-element mechanisms on a single substrate, or they can be freed entirely from their host substrate and be assembled into separate structures.

The method of this invention makes possible unheralded precision in the construction of miniature mechanical parts. Routine control of millionths of a meter is quite reasonable.

This invention has many applications in the micromechanical field, such as optical elements, valves for fluids, ratchets, timing elements, analog computing elements, digital logic elements, accelerometers, engine-knock sensors, optical shutters, and force or torque transducers.

SUMMARY OF THE INVENTION

This invention provides micromechanical members with movable parts and provides the methods for making such mechanical members with the aid of a sacrificial layer or layers placed between two or more parts of the elements. The sacrificial layer or layers are then etched or dissolved away.

The invention, for example, can employ polycrystalline silicon for the micromechanical members, and phosphosilicate glass for the sacrificial layer, but the technique is not limited to these materials. The structural members may be made from various semiconductors, metals, alloys, and dielectric materials, provided that these materials can be freed from their supporting substrate by selected etching of sacrificial or dissolvable materials.

BRIEF DESCRIPTION OF THE DRAWINGS

FIG. 1 is a greatly enlarged view in perspective of a pin-joint structure embodying the principles of the invention.

FIG. 2 is a top plan view of a pint joint like that of of FIG. 1 on the substrate on which it is fabricated.

FIG. 3 is a view in side elevation and in section showing an early stage of the process for making the structure of FIGS. 1 and 2. A layer of phosphosilicate glass has been laid down on a silicon substrate, and a layer of polycrystalline silicon or "polysilicon" has been laid down on top of the phosphosilicate glass. Thicknesses have been exaggerated so that they can be illustrated.

FIG. 4 is a view similar to FIG. 3 showing a succeeding step in the process, wherein an opening has been provided through both the polysilicon layers and down to the substrate.

FIG. 9 is a greatly enlarged view in perspective of a modified form of a pin joint also embodying the principles of the invention.

FIG. 10 is a fragmentary top plan view of the pin joint of FIG. 9 on a base formed of polysilicon that is attached to a substrate. Two rotational positions of one element are shown, one in solid lines and another in dotted lines.

FIG. 11 is a similar view with two translational portions shown, one in solid lines, one in dotted lines, and they are shown in different rotational positions.

FIG. 12 is a view in elevation of an early stage of the process for making the structure of FIGS. 9–11. A layer of phosphosilicate glass has been deposited over a silicon base, and a layer of polysilicon has been deposited over them and patterned down to the phosphosilicate glass. Thicknesses have been greatly exaggerated.

DESCRIPTION OF SOME PREFERRED EMBODIMENTS

Figure 5:
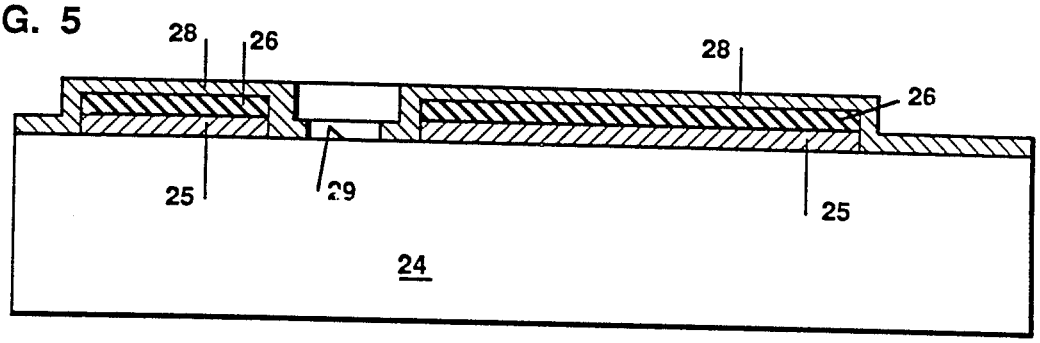
FIG. 5 is a view similar to FIG. 4 of a third step in the process, wherein a second or sacrificial layer of phosphosilicate glass has been deposited over the polysilicon of FIG. 4, over its edges, and over the openings thereof and into contact with the silicon substrate. An opening has been provided through the second layer of phosphosilicate glass to the base.
Figure 6:
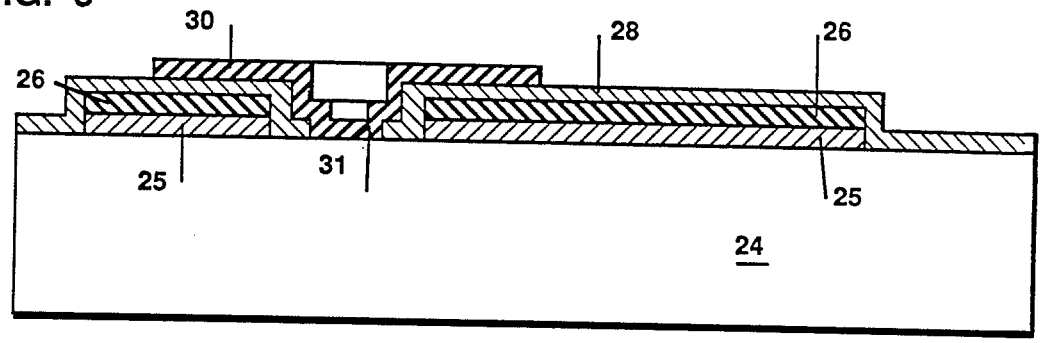
FIG. 6 is a view similar to FIGS. 3, 4 and 5, showing a fourth stage wherein a second layer of polysilicon has been deposited over the second layer of phosphosilicate glass and patterned. The second layer is also in contact with the substrate.
Figure 7:
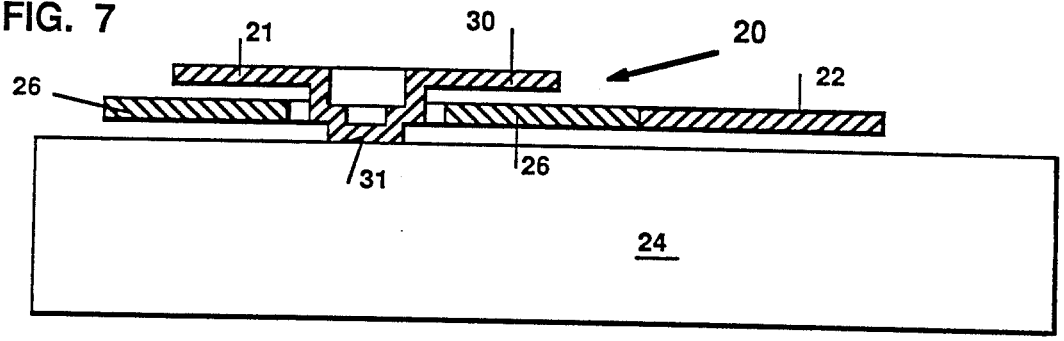
FIG. 7 is a similar view of the joint in FIG. 6 after etching out the sacrificial layers of phosphosilicate glass.
Figure 8:
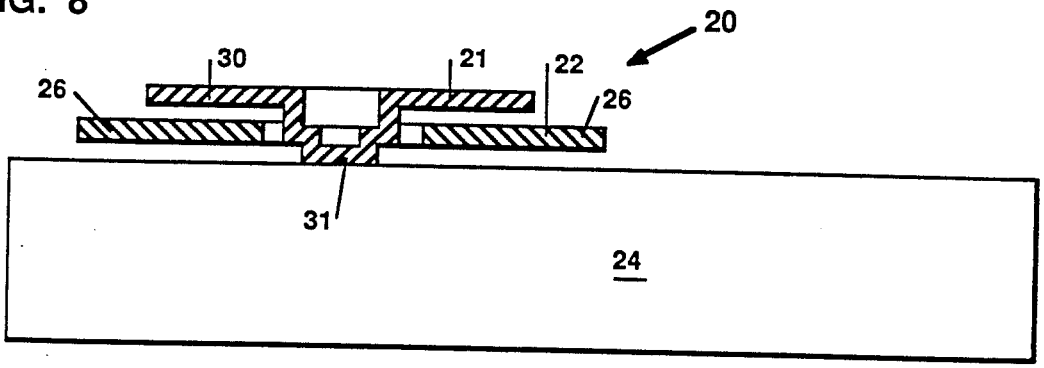
FIG. 8 is a similar view of the joint of FIG. 7 after relative rotation of the rotating element 90° from its original positions. The view corresponds to FIG. 1.
Figure 13:
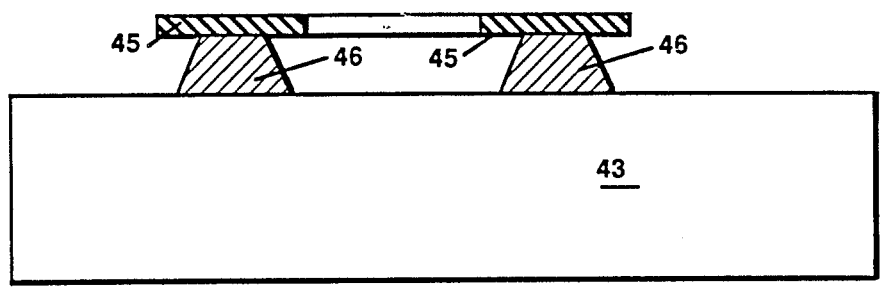
FIG. 13 is a view similar to FIG. 12 showing the succeeding step in the process, in which the phosphosilicate glass underneath the edges of the polysilicon has been etched away, leaving the polysilicon patterns supported by unetched phosphosilicate glass.

Micromechanical structures such as micrometer-scaled pin joints, gears, springs, cranks, and sliders may be made with silicon planar technology and analogous processes. They may be batch-fabricated in an IC-compatible process using polysilicon deposited by chemical vapor deposition from silane and the sacrificial-layer technique first described by Howe and Muller in "Polycrystalline Silicon Micromechanical Beams," 1982 Spring Meeting of the Electrochemical Society, Montreal, Canada (May 9–14, 1982).

An important feature of this new technology makes use of the high surface mobility of polysilicon during CVD (chemical vapor deposition) growth to refill undercut regions in order to form restraining flanges in one type of joint. The movable mechanical elements are built in stationary positions on sacrificial layers that are later removed to free the movable elements so that translation or rotation or both can take place. Although this technique for making these structures may employ polysilicon as the structural material and may employ phosphosilicate glass (PSG) for the sacrificial layer, other materials compatible with the IC process can be substituted as appropriate. The technology to produce pin joints can be adapted, with some variations, for the other structures mentioned; therefore, the pin-joint technology is discussed first.

One type of pin joint 20, shown in FIGS. 1 and 2, is composed of a hub 21 around which another member 22 is free to rotate. Such a structure may be provided by the methods of this invention in which there is a sacrificial layer between the two parts 21 and 22 of the joint 20 during one stage of manufacture. Then the sacrificial layer is selectively etched away to free the rotating member 20. The pin joint 20, as shown, has a fixed hub 21 with a rotatable member 22. The joint is produced by the process shown in FIGS. 3–8.

The substrate or base 24 may be silicon, but it may instead be of materials such as quartz, silicon nitride, forms of aluminum oxide such as sapphire, diamond, or gallium arsenide.

The requirements for any substrate material are that they should: (a) survive the full fabrication process, (b) have enough adhesion to the mechanical layers laid down on them to allow the selective etching process to be done, and (c) have etching selectivity with respect to any sacrificial materials.

The mechanical elements may be polysilicon or may be of silicon nitride or boron nitride or of silicides of tungsten, palladium, titanium, or tantalum. They may also be metals, such as tungsten, chromium, molybdenum, nickel, or alloys such as nickel-chromium.

The requirements for the mechanical elements are: (a) that they survive the full fabrication process and (b) have etching selectivity over the sacrificial materials. It is also highly desirable that they can be laid down by methods which allow them to refill undercuts as does CVD polysilicon.

To begin the process, a base or substrate 24 (or a portion thereof) of such material as silicon is covered (FIG. 3) with a layer 25 of phosphosilicate glass or PSG, and a layer 26 of polysilicon. Openings 27 are then made or provided in the composite of layers 25 and 26. Then, (FIG. 5) a sacrificial phosphosilicate glass PSG layer 28 is deposited over the layer 26, covering the edge of the hole 27. Masking and etching are used to expose a portion 29 of bare silicon of the substrate 24. Then a second, patterned layer 30 of polysilicon may be formed (FIG. 6) by chemical vapor deposition (CVD) and plasma etching. The layer 30 is anchored to the substrate 24 at a desired location 31 or locations to provide the hub portion 21. After the second polysilicon layer 30 has been deposited and patterned, the sacrificial layer 28 is removed, for example, by exposing it to buffered hydrofluoric acid (BHF). The polysilicon layers 26 and 30 remain and form the pin joint structure 20. The layer 30 includes the fixed hub 21, fixed by being mounted on and secured to the base 24 of silicon, while the polysilicon member 22 is comprised of the freed layer 26 and is rotatable about the hub 21.

The following is a more detailed description of the details of the process for making the pin joint 20.

First the surface of the substrate 24 in FIG. 3 is prepared. This may be done by 120° C. "piranha" cleaning in 1:5 $H_2O_2:H_2SO_4$ for 10 minutes, followed by a rinse in deionized water until the rinsing water has a resistivity of at least 15 MΩ-cm. It is then spin dried.

The next step is a low-temperature, phosphorous-doped oxide deposition on the surface of the substrate 24 to leave a layer of phosphosilicate glass 25. The deposition is done preferably at 450° C. to provide a thickness of about 2.0 μm. The layer 25 has a phosphorus content of about 8%.

Over this layer 25, the low-pressure chemical vapor deposition (LPCVD) layer 26 of polysilicon is deposited at about 610° C. to a thickness of about 2.0 μm. This step may be followed by stress annealing in nitrogen at about 1050° C. for 20 minutes.

To provide the opening 27, photolithography may be utilized as a mask for first-level polysilicon definition. Then plasma etching of the polysilicon is preferably done with a plasma consisting of carbon tetrachloride in an amount of 130 standard cubic centimeter per minute (sccm), 130 sccm helium, and 15 sccm oxygen at a pressure of 280 mTorr, 300W in a plasma etcher. The etching is carried to end-point detection together with 30% overetch. This plasma etching is followed by an oxide etch, preferably employing 10:1 buffered hydrofluoric acid in water. The mask is then removed by photoresist stripping, using oxygen plasma at 300 mTorr and 300W for 10 minutes.

The next step (FIG. 5) is to apply the sacrificial layer 28 by low-temperature, phosphorus-doped oxide deposition, as by first using 120° C. piranha cleaning for 10 minutes and followed by a deionized water rinse to an active resistivity of at least 15 MΩ-cm, and spin drying. This layer is a phosphorus-doped, low-temperature oxide deposited at 450° C. to a thickness of about 0.5 μm. It has a phosphorus content of about 8%.

A second mask is then prepared for contact with the substrate 24, and the oxide is etched in a 10:1 solution of buffered hydrofluoric acid followed by photoresist stripping by an oxygen plasma at 300 mTorr, 300W, for 10 minutes.

The second polysilicon layer 30 is then applied (FIG. 6) after 120° C. piranha cleaning for 10 minutes followed by deionized water rinse for 15 minutes to a resistivity of 15 MΩ-cm, and a spin dry. The polysilicon deposition 30 is made at 610° C. with a thickness of about 2 μm. This layer 30 may be improved by stress annealing it in nitrogen at 1050° C. for 20 minutes.

A third mask is then provided by photolithography to define the final boundaries of the second layer 30 of polysilicon after polysilicon plasma etching with carbon tetrachloride at 130 sccm, helium at 130 sccm, and oxygen at 15 sccm in a chamber at 280 mTorr, and at a power of 300W. The end-point detection is determined with 30% overetch. The third mask may then be removed by photoresist stripping (as by oxygen plasma at 300 mTorr 300W for 10 minutes).

Finally the sacrificial layer 28 is removed by an oxide etch, for example, a 5:1 buffered hydrofluoric acid solution. This final etch frees the members 21 and 22 (i.e., the layers 26 and 30) from each other, and completes the manufacture of the joint 20.

A second type of pin joint 40 (FIGS. 9–11) may be fabricated so that a rotating element 41 is constrained to turn around an annular hub 42, which itself may either be fixed to a substrate 43 (as it will be if a first layer of phosphosilicate glass is not etched completely away) or it will be free to be translated across the surface of the substrate 43 (if etching is completed). Such joints 40 may be used, for example, in mechanical cranks.

Figure 14:
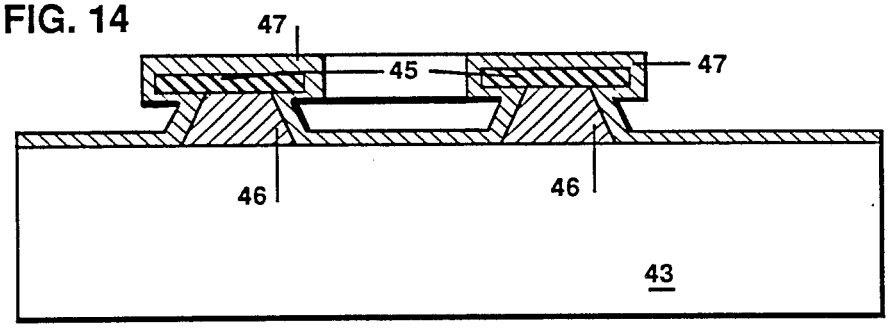
FIG. 14 is a view similar to FIGS. 12 and 13 showing a following step in the process, wherein a covering sacrificial deposit of phosphosilicate glass has covered the surfaces of the polysilicon, the phosphosilicate glass, and the silicon substrate.
Figure 15:
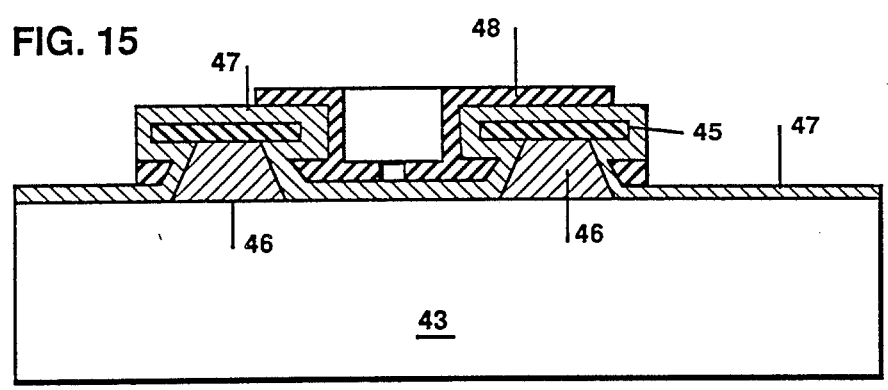
FIG. 15 is a view similar to FIG. 14 of a succeeding step, wherein a second deposit of polysilicon has been deposited and patterned down to the second layer of phosphosilicate glass.
Figure 16:
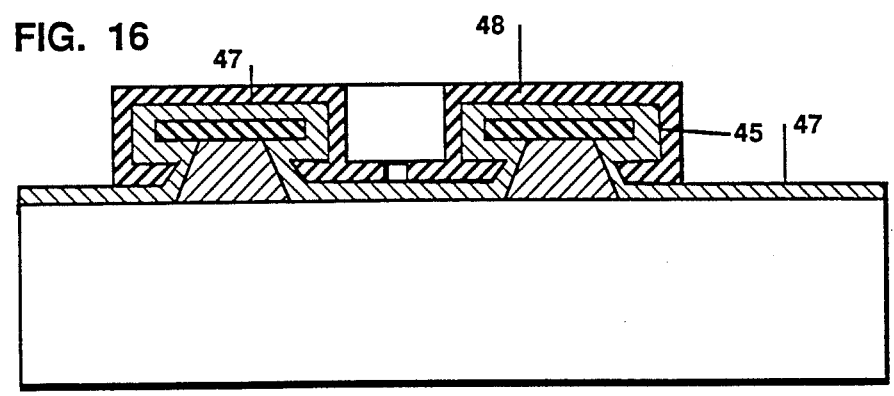
FIG. 16 is a view similar to FIG. 15, in which a restraining flange consisting of phosphosilicate glass and polysilicon has been made at the outer edges of the first polysilicon pattern.

An example of the process of making the pin joint 40 which is fixed to the substrate by a remnant first layer of phosphosilicate glass is shown in FIGS. 12–15. This is similar to the process of FIGS. 3–8 described above, but has some differences. The deposition on a base 43 of a first layer 44 of phosphosilicate glass is made as thick as the phosphosilicate glass 25 shown in FIG. 3, and then it is coated with the first layer 45 of polysilicon. Then there is a wet chemical etching operation in which the polysilicon layer 45 is undercut, and the glass therefore dissolved except for a layer portion 46 as shown in FIG. 12. The etching leaves the polysilicon 45 supported by a small pedestal 46, which remains from the first layer 44 of phosphosilicate glass. A second PSG layer 47 is then applied (FIG. 14) to coat the first layer 45 of polysilicon and to surround and overlie the pedestals 46 of phosphosilicate glass. The next operation is that a second layer 48 of polysilicon is applied, meshed, and patterned as shown in FIG. 15, to perform the desired function. As FIG. 16 shows, the second layer 47 of PSG is then etched away, leaving the two polysilicon members 45 and 48 in place, but so held that they are both rotatable and translatable as a unit across the substrate surface.

In somewhat more detail, this second process calls again for preparation of the substrate 43 by 120° C. piranha cleaning for 10 minutes and a deionized water rinse done until the deionized water has a resistivity of 15 mΩ-cm and then spin drying. Low-temperature oxide deposition is then made at about 450° C. to a thickness of 1.0 μm with a phosphorous content of 8% to provide the first layer 44 of phosphosilicate glass, as shown in FIG. 12.

The first layer 45 of polysilicon is then deposited (FIG. 12) at about 610° C. to a thickness of 1.0 μm. With the aid of photolithography a mask is made to pattern the first layer 45 of polysilicon and it is etched, as by plasma etching employing carbon tetrachloride 130 sccm, helium 130 sccm, oxygen 15 sccm at 280 mTorr, 300W. End-point detection is provided with 30% overetch. The low-temperature oxide layer 44 is then etched with 5:1 aqueous solution of buffered hydrofluoric acid with up to 50% overetch to provide the pedestals 46 shown in FIG. 13. The mask is removed by photoresist stripping, using oxygen plasma at 300 mTorr, 300W for 10 minutes.

The wafer as so far constructed is then prepared with 120° C. piranha cleaning for 10 minutes followed by a deionized water rinse until the deionized water has a resistivity of 15 MΩ-cm, followed by spin drying. Over this then is deposited the second low-temperature oxide layer 47 to a thickness of about 0.5 micrometers and a phosphorous content of 8%, to give the phosphosilicate glass 47 (FIG. 14).

The wafer as so far prepared is then again subjected to to 120° C. piranha cleaning for 10 minutes and a deionized water rinse to 15 MΩ-cm followed by spin dry.

The next layer 48 of LPCVD polysilicon is deposited (FIG. 15), preferably at 610° C. to a thickness of about 1.0 μm. By photolithography the second mask is used to pattern the second layer 48 of polysilicon when it is etched by the aforementioned plasma etching, employing carbon tetrachloride 130 sccm, helium 130 sccm, and oxygen 15 sccm, at 280 mTorr, 300W with end-point detection set for 30% overetch.

Figure 17:
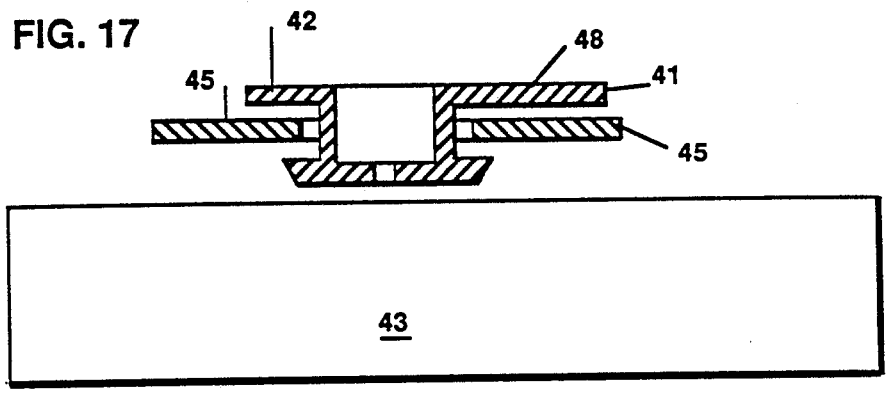
FIG. 17 is a view like FIG. 15 showing the assembly after etching away of the sacrificial layers, thereby producing a finished pin joint corresponding to the structure shown in FIG. 9.
Figure 18:
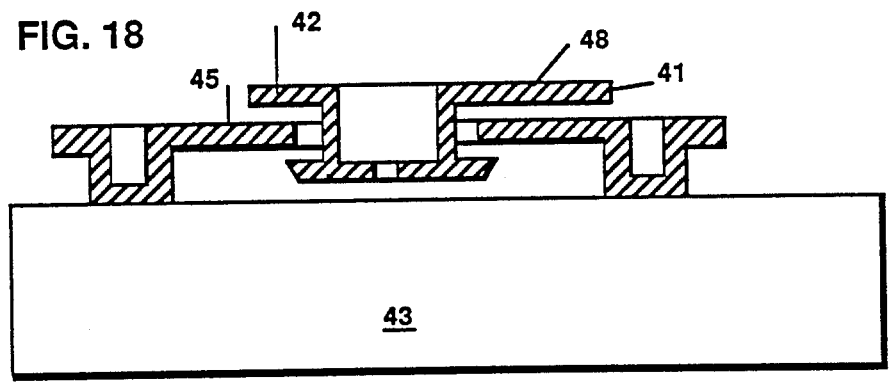
FIG. 18 is a view similar to FIG. 17, showing that the first layer of polysilicon has been anchored on the substrate. An extra step of etching openings on the first layer of phosphosilicate glass before the first step in FIG. 12 is done to make the structure of FIG. 17.

After the polysilicon etching to shape the layer 48, the photoresist is removed by photoresist stripping, using oxygen plasma at 300 mTorr, 300W for 10 minutes (FIG. 16). Once again, the resulting wafer is prepared as by 120° C. piranha cleaning for 10 minutes and the deionized water rinse to a resistivity of 15 MΩ-cm, followed by spin drying. Stress annealing may then be applied in nitrogen at 1050° C. for 30 minutes. Finally, this is followed by an etch removing the second phosphosilicate glass layer 47 to free the polysilicon members 45 and 48 or beams from each other (FIGS. 17 and 18). A 5:1 aqueous solution of hydrofluoric acid may be used to accomplish this.

Figure 19:
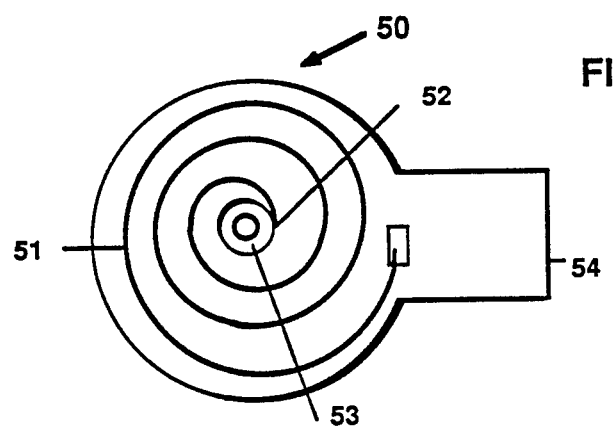
FIG. 19 is a greatly enlarged top view in perspective of a spring-restrained pin joint embodying the principles of the invention. The spring is a spiral of polysilicon attached to a fixed hub and to a moving element.

FIG. 19 shows a spring-restrained pin joint 50. This structure consists of a pin joint 20 like that shown in FIG. 1 and a restraining spring. This spiral spring 51 extends through 2.5 revolutions and is made of 2 $\mu$m-wide second-layer polysilicon. The central end 52 of the spring 51 is connected to a hub 53, 5 $\mu$m in radius, and the outer end is connected to a movable arm 54. The horizontal spiral spring structures have many possible applications such as ratchet closures and brush-contact detentes. The spring 51 returns the disc element to its original position after any displacement.

Figure 20:
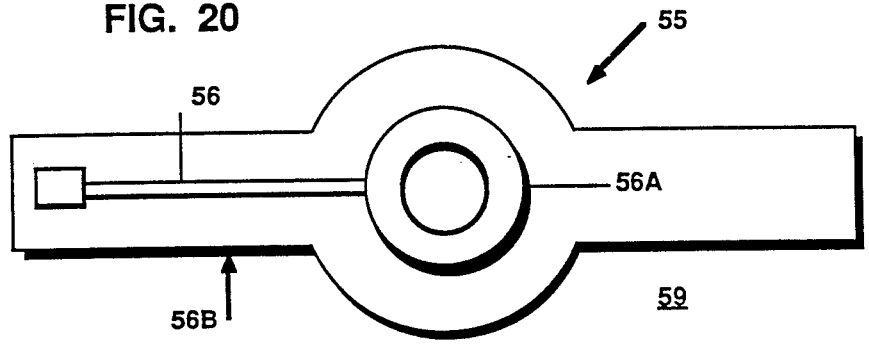
FIG. 20 is a greatly enlarged top view of a beam-restrained pin joint embodying the principles of the invention. The polysilicon spring is attached to the hub, which is fixed to the substrate, and to the moving element.

A number of structures were produced by the technology described above. FIG. 20 shows a beam-restrained pin joint 55. This structure is similar to that of FIG. 19 except that a polysilicon beam 56 is used as a spring instead of the spiral spring. This leaf spring is 60 $\mu$m long and 2 $\mu$m wide.

Figure 21:
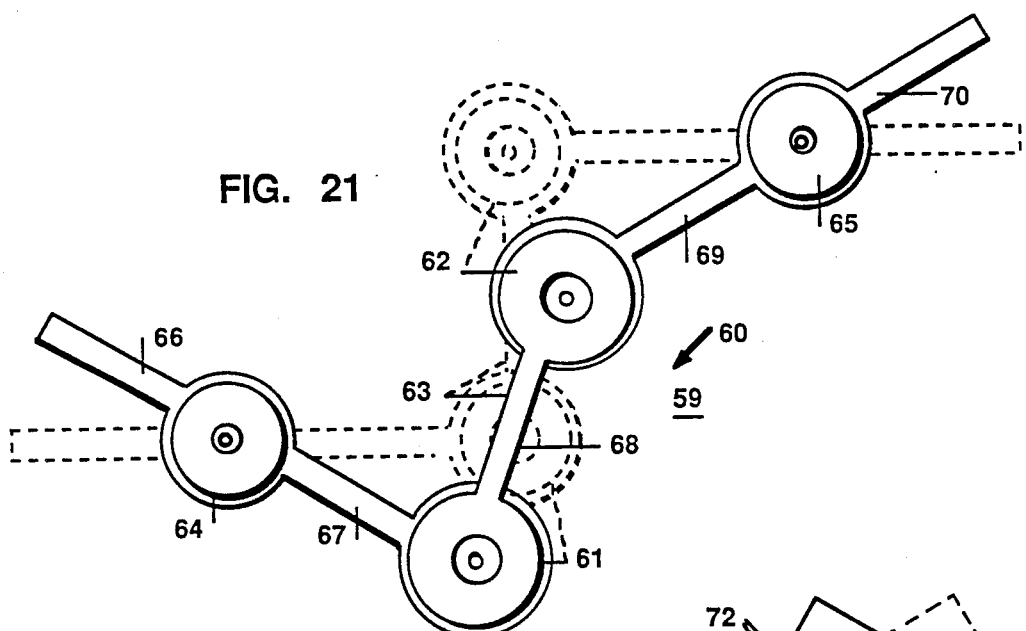
FIG. 21 is a greatly enlarged top plan view of a four-joint crank embodying the principles of the invention. One position thereof is shown in solid lines, and another position is shown in dotted lines.

FIG. 21 shows a more complicated crank structures composed of levers and both fixed and translatable rotating pin joints. FIG. 21 shows a four-joint crank 60. The joints 61 and 62 at both ends of a central polysilicon mechanical element 63 are "type 2" joints and thus are free to translate across the substrate 59. The other two (outside) joints 64 and 65 have hubs that are pinned to the substrate 59. Each of the mechanical elements 66, 67, 68, 69, and 70 are 150 $\mu$m long.

Figure 22:
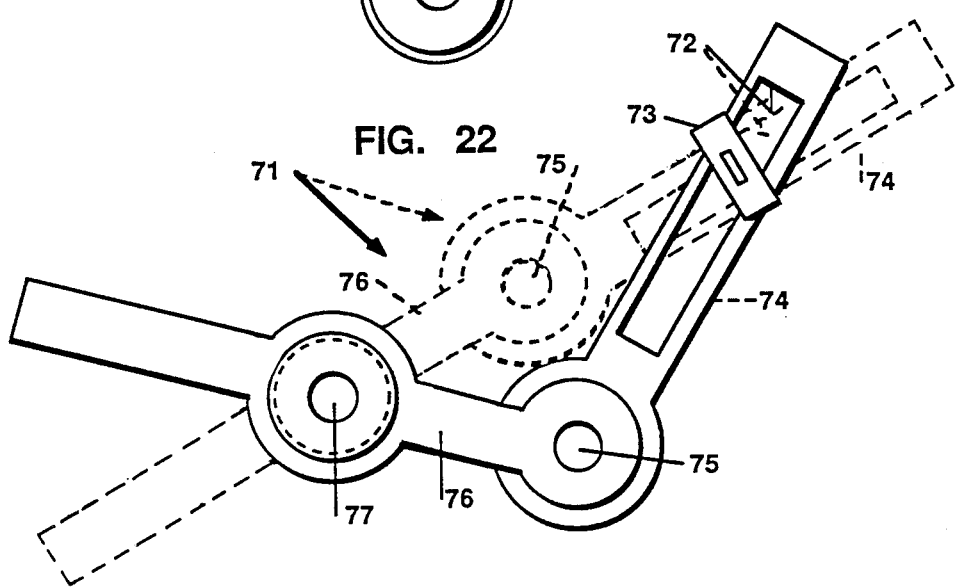
FIG. 22 is a greatly enlarged view of a crank-slot combination also embodying the principles of the invention. One position is shown in solid lines, and another position is shown in dotted lines.

FIG. 22 shows a crank-slot combination 71. A slot 72 slides on an element 73 that is fixed to the substrate. The slotted element 74 is attached to a hub 75 that can translate as well as rotate. The hub 75 is attached on the end of an element 76 on a fixed hub 77. The slot 72 as made was 100 $\mu$m long and 20 $\mu$m wide. The diameter of the two joints was 50 $\mu$m.

Figure 23:
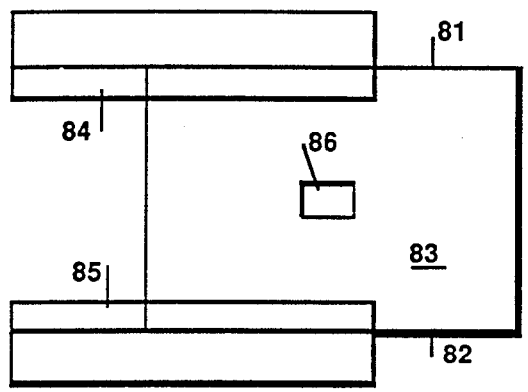
FIG. 23 is a greatly enlarged view of a square slide structure, with the restraining flanges similar to the pin joint in FIG. 1.

FIG. 23 shows a square slide 80 with two edge flanges 81 and 82 made of first-layer polysilicon to allow translation along one direction only. The two edges 81 and 82 of the polysilicon rectangle 83 are restricted by elements 84 and 85 made of second-layer polysilicon, so that the slide 80 can move in only one dimension. The small opening 86 at the center serves to reduce the etch time of the sacrificial phosphosilicate glass layers. A possible application of this structure is for a micro-positioning table. A slide 80 was made and was 100 by 100 $\mu$m and the central opening 86 was 10 by 10 $\mu$m.

Figure 24:
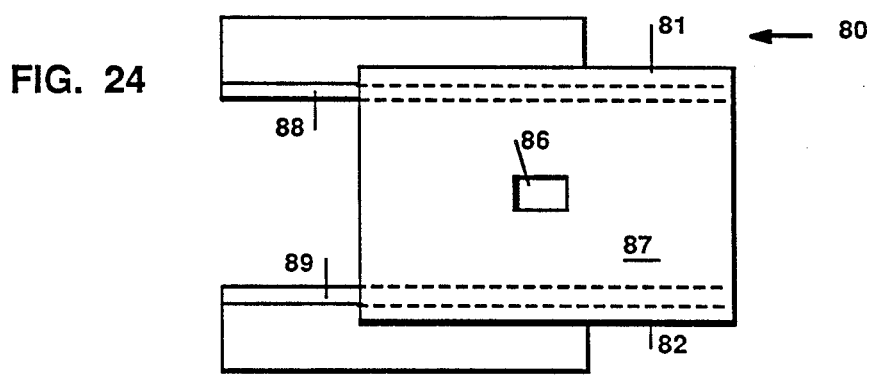
FIG. 24 is a greatly enlarged top view of a square slide structure with the restraining flanges similar to the pin joint shown in FIG. 9.

FIG. 24 shows a slide structure similar to that shown in FIG. 23. The slider 87 is made of second layer polysilicon instead. The restricting members 88, 89 are made of first-layer polysilicon.

Figure 25:
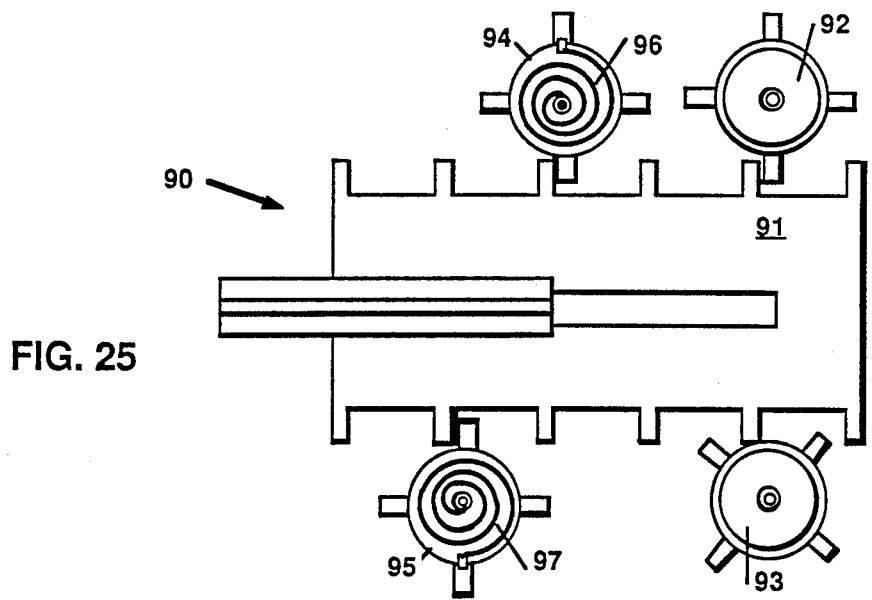
FIG. 25 is a similar view of a gear-slide embodiment of principles of the invention, with spring structures like the spring of FIG. 19 and gears that mesh with teeth on the sliding element.

FIG. 25 shows an assembly 90 formed of a slide 91 with gears 92, 93, 94 and 95 and springs 96 and 97. Two of the four-tooth gears 94 and 95 are each restrained by a polysilicon spring 96 or 97 that can be stretched by the toothed slide 91.

Such movable slide 90 was made and measures 210 by 100 $\mu$m, and had a guide at the center so that only translational movement was allowed. The toothed edges align with four 4-tooth gears, which allow translational motions to be interconnected with gear rotation.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A method for making a microminiature structure with two members measuring less than 100 $\mu$m in any linear dimension and relatively movable to each other, comprising the steps of:
    (a) providing a first sacrificial coating over a substrate having openings therethrough to expose a portion of the substrate,
    (b) depositing a first structural layer over said first sacrificial coating and the exposed portion of the substrate, with openings therethrough to expose a second portion of the substrate,
    (c) providing a second sacrificial coating over said second exposed portion of the substrate and said first structural layer, with openings through both the first and second sacrificial layers to expose a third portion of the substrate,
    (d) adding a second structural layer thereover and defining it, and
    (e) etching the first and second sacrificial layers to remove them completely so that the two structural layers become movable relative to each other.

2. The method of claim 1 wherein said sacrificial coating consists of material selected from the group consisting of silicon oxide, silicon nitride, polyimide, and resists, including photoresists.

3. The method of claim 1 wherein said structural layers consists of material selected from the group consisting of polysilicon, silicon nitride, and silicides.

4. The method of claim 1 wherein said structural layers consist of a metal.

5. The product resulting from the method of claim 1.

6. The product of claim 5 wherein said product is a microminiature pin joint.

7. The product of claim 5 wherein said product is an X-Y micropositioning moving table.

8. The product of claim 5 wherein said product is a micromechanical force or torque transducer.

9. The product of claim 5 wherein said product is a micromechanical ratchet.

10. The product of claim 5 wherein said product is an analog micromechanical computing device.

11. The product of claim 5 wherein said product is a digital micromechanical logic device.

12. The product of claim 5 wherein said product is an accelerometer.

13. The product of claim 5 wherein said product is an engine knock sensor.

14. The product of claim 5 wherein said product is a micromechanical optical shutter.

15. The product of claim 5 wherein said product is a micromechanical fluid valve.

16. A method for making a microminiature pin joint with two members relatively movable to each other, comprising the steps of:
    (a) providing a first sacrificial coating over a substrate having openings therethrough to expose a portion of the substrate,
    (b) depositing a first structural layer over said first sacrificial coating and the exposed portion of the substrate, with openings therethrough to expose a second portion of the substrate,
    (c) providing a second sacrificial coating over said second exposed portion of the substrate and said first structural layer, with openings through both the first and second sacrificial layers to expose a third portion of the substrate, (d) adding a second structural layer thereover and defining it, and (e) etching the first and second sacrificial layers to remove them completely so that the two polysilicon layers become movable relative to each other.

17. The product resulting from the method of claim 16.

18. A method for making a microminiature device with two members relatively movable to each other, comprising the steps of:

(a) cleaning thoroughly and preparing a substrate wafer, (b) providing a first sacrificial layer thereon, said layer having a high etching rate in a selected etchant, (c) providing openings through said first sacrificial layer to expose a portion of the substrate, (d) depositing over said first sacrificial layer and the exposed portion of the substrate a first structural layer, (e) defining a selected area of said first structural layer and providing openings through that area of said structural layer and said first sacrificial layer to expose a second portion of said substrate, (f) coating a second sacrificial layer over said second exposed portion of said substrate and the edges of the openings leading thereto and said first structural layer, (g) providing openings through both said first and second sacrificial layers to expose a third portion of said substrate, (h) adding a second structural coating to form a second layer thereover and defining it, and (i) etching the first and second sacrificial layers to remove them completely so that said first and second structural layers become moveable relative to each other.

19. The device of claim 18 wherein said sacrificial coating consists of material selected from the group consisting of silicon oxide, silicon nitride, polyimide, and resists, including photoresists.

20. The device of claim 18 wherein said structural layers consists of material selected from the group consisting of polysilicon, silicon nitride, and silicides.

21. The device of claim 18 wherein said structural layers consist of a metal.

22. The product resulting from the method of claim 18.

23. A method for making a microminiature pin joint with two members relatively movable to each other, comprising the steps of:

(a) cleaning thoroughly and preparing a substrate wafer, (b) providing a first sacrificial layer thereon, said layer having a high etching rate in a selected etchant, (c) providing openings through said first sacrificial layer to expose a portion of the substrate, (d) depositing over said first sacrificial layer and the exposed portion of the substrate a first structural layer, (e) defining a selected area of said first structural layer and providing openings through that area of said structural layer and said first sacrificial layer to expose a second portion of said substrate, (f) coating a second sacrificial layer over said second exposed portion of said substrate and the edges of the openings leading thereto and said first structural layer, (g) providing openings through both said first and second sacrificial layers to expose a third portion of said substrate, (h) adding a second structural coating to form a second layer thereover and defining it, and (i) etching the first and second sacrificial layers to remove them completely so that said first and second structural layers become movable relative to each other.

24. The pin joint resulting from the method of claim 23.

25. A method for making a microminiature device with at least two members relatively movable to each other, comprising the steps of:

(a) cleaning thoroughly and preparing a silicon substrate wafer, (b) providing a first layer of an oxide thereon, said oxide having a high etching rate in a selected etching acid, (c) providing openings through said first oxide layer to expose a portion of said substrate, (d) depositing over said first oxide layer and the exposed portion of said substrate a first layer of polysilicon, (e) defining a selected area of said first layer of polysilicon and providing openings through that area of said first polysilicon layer and said first oxide layer, to expose a second portion of the base substrate, (f) coating a second oxide layer over said second exposed portion of said substrate and the edges of the openings leading thereto and said first layer of polysilicon, (g) providing openings through both the first and second oxide layers to expose a third portion of said substrate, (h) adding a second coating of polysilicon to form a second polysilicon layer thereover and defining it, and (i) etching said first and second oxide layers to remove them completely, so that the first and second polysilicon layers become movable relative to each other.

26. The device resulting from the method of claim 25.

27. A method for making a microminiature pin joint with two members relatively movable to each other, comprising the steps of;

(a) cleaning thoroughly and preparing a silicon substrate wafer, (b) providing a first layer of an oxide thereon, said oxide having a high etching rate in a selected etching acid, (c) providing openings through said first oxide layer to expose a portion of said substrate, (d) depositing over said first oxide layer and the exposed portion of said substrate a first layer of polysilicon, (e) defining a selected area of said first layer of polysilicon and providing openings through that area of said first polysilicon layer and said first oxide layer, to expose a second portion of the base substrate, (f) coating a second oxide layer over said second exposed portion of said substrate and the edges of the openings leading thereto and said first layer of polysilicon, (g) providing openings through both the first and second oxide layers to expose a third portion of said substrate, (h) adding a second coating of polysilicon to form a second polysilicon layer thereover and defining it, and (i) etching said first and second oxide layers to remove them completely, so that the first and second polysilicon layers become movable relative to each other.

28. The pin joint resulting from the method of claim 27.

29. A method for making a microminiature pin joint with two members relatively movable to each other, comprising the steps of:

(a) cleaning thoroughly and preparing a silicon substrate wafer, (b) providing a first layer of phosphosilicate glass thereon, (c) providing openings through said first phosphosilicate glass layer to expose a portion of said substrate, (d) depositing over said first phosphosilicate glass layer and the exposed portion of said substrate a first layer of polysilicon, (e) defining a selected area of said first layer of layer polysilicon and providing openings through that area of said first polysilicon layer and said first layer of coating to expose a second portion of said substrate, (f) coating a second phosphosilicate glass layer over said second exposed portion of said substrate and the edges of the openings leading thereto and said first layer of polysilicon, (g) providing openings through both the first and second layers of phosphosilicate glass to expose a third portion of said substrate, (h) adding a second coating of polysilicon to form a second polysilicon layer thereover and defining it, and (i) etching said first and second phosphosilicate glass layers to remove them completely, so that said first and second polysilicon layers become movable relative to each other.

30. The pin joint resulting from the method of claim 29.

31. A method for making a microminiature device having at least two members relatively movable to each other, comprising the steps of:

(a) cleaning thoroughly and preparing a silicon substrate wafer, (b) providing a first layer of phosphosilicate glass thereon, (c) providing openings through said first phosphosilicate glass layer to expose a portion of said substrate, (d) depositing over said first phosphosilicate glass layer and the exposed portion of said substrate a first layer of polysilicon, (e) defining a selected area of said first layer of layer polysilicon and providing openings through that area of said first polysilicon layer and said first layer of coating to expose a second portion of said substrate, (f) coating a second phosphosilicate glass layer over said second exposed portion of said substrate and the edges of the openings leading thereto and said first layer of polysilicon, (g) providing openings through both the first and second layers of phosphosilicate glass to expose a third portion of said substrate, (h) adding a second coating of polysilicon to form a second polysilicon layer thereover and defining it, and (i) etching said first and second phosphosilicate glass layers to remove them completely, so that said first and second polysilicon layers become movable relative to each other.

32. The device resulting from the product of claim 31.

33. The device of claim 32 wherein the device is a coil spring.

34. The device of claim 32 wherein the device is a spring-restrained pin joint.

35. The device of claim 32 wherein the device is a beam-restrained pin joint.

36. The device of claim 32 wherein the device is a four-joint crank.

37. The device of claim 32 wherein the device is a crank-slot combination.

38. The device of claim 32 wherein the device is a rectangular slide structure with restraining flanges.

39. The device of claim 32 wherein the device is a gear-slide combination with a spring restraining member and gears that mesh with teeth on a sliding element.

40. A method for making a microminiature structure with a plurality of members measuring less than 1000 $\mu$m in any linear dimension and relatively movable to each other, comprising the steps of:

(a) providing a first sacrificial coating over a substrate having openings therethrough to expose a portion of the substrate, (b) depositing a first structural layer over said first sacrificial coating and the exposed portion of the substrate, with openings therethrough to expose a second portion of the substrate, (c) providing additional sacrificial coatings successively over such exposed portions of substrate and a said structural layer, with openings through said sacrificial layers to expose other portions of the substrate, (d) adding additional structural layers over each said sacrificial coating and defining it, and (e) etching the sacrificial layers to remove them completely so that the plurality of structural layers become movable relative to each other.

* * * * *